(12) United States Patent
Guenther

(10) Patent No.: US 11,885,832 B2
(45) Date of Patent: Jan. 30, 2024

(54) SIGNAL ANALYZER

(71) Applicant: Rohde & Schwarz GmbH & Co. KG, Munich (DE)

(72) Inventor: Thomas Guenther, Waldenburg (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 206 days.

(21) Appl. No.: 17/067,930

(22) Filed: Oct. 12, 2020

(65) Prior Publication Data
US 2022/0113335 A1   Apr. 14, 2022

(51) Int. Cl.
*G01R 13/02* (2006.01)
*G01R 23/16* (2006.01)
*G06N 3/08* (2023.01)
*G06N 20/00* (2019.01)
*H04B 17/309* (2015.01)

(52) U.S. Cl.
CPC ........... *G01R 13/029* (2013.01); *G01R 23/16* (2013.01); *G06N 3/08* (2013.01); *G06N 20/00* (2019.01); *H04B 17/309* (2015.01)

(58) Field of Classification Search
CPC .... G01R 13/029; G01R 23/16; H04B 17/309; G06N 20/00; G06N 3/08
See application file for complete search history.

(56) References Cited

U.S. PATENT DOCUMENTS

| | | | |
|---|---|---|---|
| 4,353,032 A | 10/1982 | Taylor | |
| 6,718,316 B1 * | 4/2004 | Higgins | G06N 3/045 706/15 |
| 9,506,951 B2 * | 11/2016 | Taratorin | G01R 13/029 |
| 2005/0261853 A1 * | 11/2005 | Dobyns | G01R 13/0272 702/108 |
| 2009/0055111 A1 * | 2/2009 | Williams | G01R 13/0263 702/66 |
| 2012/0173188 A1 | 7/2012 | Cake et al. | |
| 2017/0003321 A1 * | 1/2017 | Kelly | G01R 23/02 |
| 2018/0128857 A1 * | 5/2018 | Ohlen | G01R 13/0254 |
| 2019/0079115 A1 * | 3/2019 | Barthel | G01R 13/0254 |

OTHER PUBLICATIONS

U.S. Appl. No. 16/570,684, filed Sep. 13, 2019.

* cited by examiner

*Primary Examiner* — Manuel L Barbee
(74) *Attorney, Agent, or Firm* — DITTHAVONG, STEINER & MLOTKOWSKI

(57) ABSTRACT

The invention relates to a signal analyzer, comprising a signal receiving unit configured to receive a signal, in particular a radio frequency (RF) signal, a digitizing unit configured to digitize the received signal, and a trigger detection unit configured to detect a trigger event in the digitized signal. The signal analyzer further comprises an acquisition unit configured to store a segment of the digitized signal in a memory of the signal analyzer if the trigger detection unit detects the trigger event in the digitized signal, and an anomaly search unit configured to analyze the stored segment of the digitized signal in order to detect signal anomalies, in particular glitches, in the stored segment of the digitized signal.

12 Claims, 3 Drawing Sheets

SIGNAL ANALYZER

TECHNICAL FIELD OF THE INVENTION

The invention relates to the technical field of analyzing signals, e.g. radio frequency signals. In particular, the invention relates to a signal analyzer and to a method for analyzing a signal.

BACKGROUND OF THE INVENTION

Many test instruments, such as oscilloscopes, are configured to receive and display measurement signals. Sometimes a user sees a signal anomaly or a glitch in the signal while performing a measurement. Often the user then wants to further analyze said anomaly or glitch to find out its cause.

It is known to use a so-called trigger function of the oscilloscope to find such anomalies in a measurement signal by triggering on expected features of the anomaly. However, setting a suitable trigger for an unknown signal anomaly is difficult and may require various attempts.

The document US 2012/0173188 A1, for example, discloses a method and an apparatus for determining a trigger in a test and measurement apparatus. Thereby, a first trigger configuration is loaded to a first trigger element and a second trigger configuration is loaded to a second trigger element of the test and measurement apparatus so that these trigger elements operate substantially simultaneously.

However, until a suitable trigger is found, an anomaly may have disappeared again. Further, the user often has to interrupt his normal work on the instrument, while he is searching for the anomaly via the trigger function.

SUMMARY OF THE INVENTION

The present invention is defined by the enclosed independent claims. Advantageous implementations of the present invention are further defined in the dependent claims.

According to a first aspect, the invention relates to a signal analyzer, comprising a signal receiving unit configured to receive a signal, in particular a radio frequency (RF) signal; a digitizing unit configured to digitize the received signal; a trigger detection unit configured to detect a trigger event in the digitized signal; an acquisition unit configured to store a segment of the digitized signal in a memory of the signal analyzer if the trigger detection unit detects the trigger event in the digitized signal; and an anomaly search unit configured to analyze the stored segment of the digitized signal in order to detect signal anomalies, in particular glitches, in the stored segment of the digitized signal.

This achieves the advantage that signal anomalies and glitches can be efficiently detected and stored for a later analysis. In particular, the signal analyzer can perform the signal anomaly detection in the background such that a user does not have to interrupt his work on the instrument. The user can rather finish his normal work on the signal analyzer and then investigate any anomalies and glitches in the stored segments.

A further advantage is that the trigger event settings do not have to be precisely tailored to a certain anomaly or glitch. The trigger event can be roughly adjusted and false positives, i.e. segments without an anomaly, can be discarded if the anomaly search unit detects no anomalies in the segment. Thus, it is easier to detect and analyze the first occurrence of a new anomaly.

In an embodiment, the signal analyzer comprises a display, wherein the display is configured to display a list of: stored segments of digitized signals, detected signal anomalies and/or time stamps of the detected signal anomalies. This achieves the advantage that a user can access signal anomalies that occurred during a normal operation of the signal analyzer at a later point in time, e.g. for a further analysis.

In an embodiment, the anomaly search unit is configured to use a machine learning algorithm to detect the anomalies in the stored segment of the digitized signal. This achieves the advantage that anomalies can be detected efficiently. In particular, the machine learning algorithm can be a deep learning algorithm.

In an embodiment, the anomaly search unit comprises a trained neural network. This achieves the advantage that anomalies can be detected efficiently. In particular, the neural network was trained to detect different types of signal anomalies. The neural network can execute the machine learning algorithm.

In an embodiment, the trigger detection unit is configured to detect the trigger event based on the digital signal exceeding or falling below a certain signal level and/or the digital signal having a certain preset signal shape. This achieves the advantage that the trigger event can be detected efficiently.

In an embodiment, the signal anomalies are associated with the signal, in particular with the stored segment of the digitized signal.

In an embodiment, the anomaly search unit is configured to detect the signal anomalies based on a change, in particular a frequently occurring change, of the level of the digitized signal above or below a threshold value, by a deviation of the digitized signal from a cyclical signal shape and/or by a deviation of the digitized signal from a known signal spectrum. This achieves the advantage that signal anomalies or glitches can be detected efficiently.

In an embodiment, the signal analyzer comprises an oscilloscope.

The signal analyzer can further be a spectrum analyzer and/or a vector signal analyzer.

All the above-mentioned embodiments and/or optional features of the signal analyzer can be combined.

According to a second aspect, the invention relates to a method for analyzing a signal, in particular radio frequency (RF) signal, comprising:
  receiving the signal;
  digitizing the received signal;
  detecting a trigger event in the digitized signal;
  storing a segment of the digitized signal in a memory if the trigger event is detected in the digitized signal; and
  analyzing the stored segment of the digitized signal in order to detect signal anomalies, in particular glitches, in the stored segment of the digitized signal.

This achieves the advantage that signal anomalies and glitches can be efficiently detected and stored for a later analysis. In particular, the method can be performed by a signal analyzer in the background, such that a user does not have to interrupt his normal work on the instrument. The user can rather finish his normal work on the signal analyzer and then investigate any anomalies and glitches in the stored segments.

In particular, the anomaly search unit is configured to detect said anomalies, in particular glitches, in the stored segment of the digitized signal.

In an embodiment, the method further comprises the step of displaying a list of stored segments of digitized signals, detected signal anomalies and/or time stamps of the detected signal anomalies. This achieves the advantage that a user can access signal anomalies that occurred during a normal operation of the signal analyzer at a later point in time, e.g. for a further analysis.

In an embodiment, the step of analyzing the stored segment of the digitized signal is carried out by a machine learning algorithm, which is preferably employed by a trained neural network. This achieves the advantage that the segment can be analyzed efficiently. In particular, the machine learning algorithm is a deep learning algorithm.

In an embodiment, wherein the trigger event is detected based on the digital signal exceeding or falling below a certain signal level and/or the digital signal having a certain preset signal shape. This achieves the advantage that the trigger event is detected efficiently.

In an embodiment, the trigger event, in particular a trigger type and/or a trigger parameter of the trigger event, is determined by a further neural network.

In an embodiment, the signal anomalies are associated with the signal, in particular with the stored segment of the digitized signal.

In an embodiment, the signal anomalies are detected based on a change, in particular a frequently occurring change, of the level of the digitized signal above or below a threshold value, by a deviation of the digitized signal from a cyclical signal shape and/or by a deviation of the digitized signal from a known signal spectrum. This achieves the advantage that the signal anomalies can be detected efficiently.

All the above-mentioned embodiments and/or optional features of the method for analyzing a signal can be combined.

The above description with regard to the signal analyzer according to the first aspect of the invention is correspondingly valid for the method for analyzing a signal according to the second aspect of the invention.

In particular, the method for analyzing a signal according to the second aspect of the invention can be carried out by the signal analyzer according to the first aspect of the invention.

BRIEF DESCRIPTION OF THE DRAWINGS

The invention will be explained in the followings together with the figures.

DETAILED DESCRIPTION OF THE PREFERRED EMBODIMENTS

Figure 1:
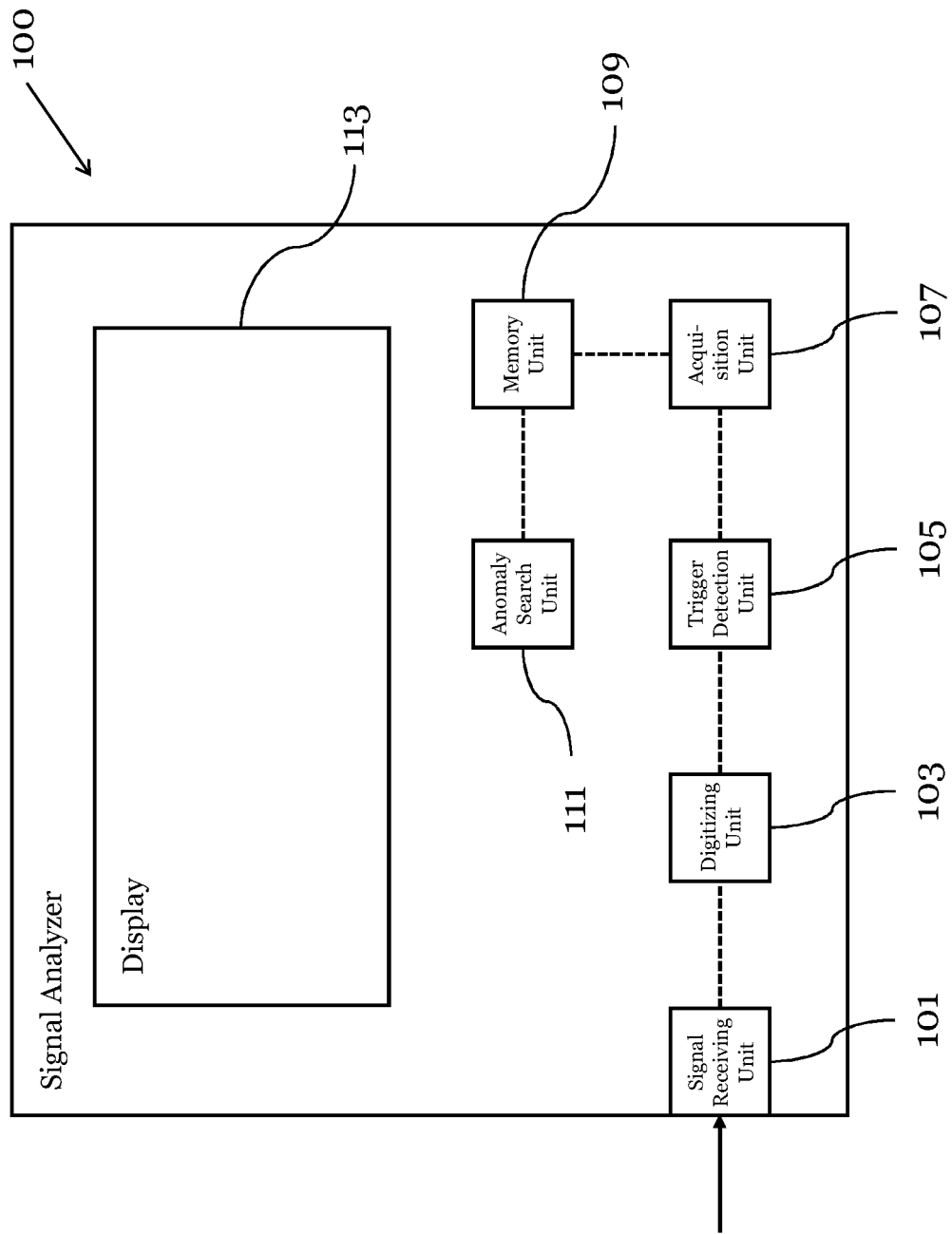
FIG. 1 shows a schematic diagram of a signal analyzer according to an embodiment.

FIG. 1 shows a schematic diagram of a signal analyzer 100 according to an embodiment.

The signal analyzer 100 comprises a signal receiving unit 101 configured to receive a signal, in particular a radio frequency (RF) signal, a digitizing unit 103 configured to digitize the received signal and a trigger detection unit 105 configured to detect a trigger event in the digitized signal. The signal analyzer 100 further comprises an acquisition unit 107 configured to store a segment of the digitized signal in a memory 109 of the signal analyzer if the trigger detection unit 105 detects the trigger event in the digitized signal, and an anomaly search unit 111 configured to analyze the stored segment of the digitized signal in order to detect signal anomalies, in particular glitches, in the stored segment of the digitized signal.

The signal analyzer 100 can be a spectrum analyzer and/or a vector signal analyzer. In particular, the signal analyzer 100 comprises an oscilloscope or is integrated in an oscilloscope.

The signal analyzer 100 can be configured to record the signal in time domain or in the frequency domain.

The signal receiving unit 101 may comprise an interface for connecting an external device. The external device can be a device under test (DUT), e.g. a mobile telecommunication device, which generates the signal that is received by the signal analyzer 100. For instance, the signal generated by the external device is an RF signal.

In particular, the signal that is recovered by the signal receiving unit 101 is an analog signal, which is then digitized by the digitizing unit 103. The digitizing unit 103 can therefore comprise an analog-to-digital converter (ADC).

The signal analyzer 100 in FIG. 1 further comprises a display 113. The display 113 can be configured to display a list of stored segments of digitized signals, detected signal anomalies and/or time stamps of the detected signal anomalies. A user can access this list, for example, after performing a measurement with the signal analyzer 100 in order to search and analyze any anomalies that occurred during the measurement.

The display 113 can also be configured to receive the digitized signal from the digitizing unit 103 and to display said digitized signal.

Furthermore, the display 113 can be configured to show notifications whenever a trigger event is detected, a segment is stored in the memory and/or an anomaly is detected in a stored segment.

The trigger detection unit 105, the acquisition unit 107 and/or the anomaly search unit 111 can each be implemented in a processor, in particular in the same processor, of the signal analyzer 100.

Preferably, the anomaly search unit 111 comprises a trained neural network, which uses a machine learning algorithm to detect the anomalies in the stored segment of the digitized signal. The neural network can be trained to detect various types of anomalies in different types of signals and for different measurement modes of the signal analyzer 100.

The memory 109 can be a segment memory of the device. In particular, the memory 109 is a flash memory.

The trigger detection unit 105 can be configured to detect the trigger event based on the digital signal exceeding or falling below a certain signal level and/or the digital signal having a certain preset signal shape. Alternatively, the trigger detection unit 105 can be configured to detect if the digital signal deviates from a preset signal shape. The trigger event can, thereby, be defined by a trigger type and by a trigger parameter. The trigger type can be an edge trigger, a glitch trigger, a width trigger, a runt trigger, a window trigger or a zone trigger, and the trigger parameter can be a threshold value, a width value or a signal period value.

Preferably, the trigger detection unit 105 is configured to apply a frequency-selective trigger that triggers the acquisition unit 107 to store a signal segment based on spectral events that meet particular criteria with respect to a user-defined frequency mask.

In particular, the signal analyzer 100 can be connected to a further neural network, e.g. a cloud hosted neural network. The further neural network can be configured to determine a suitable trigger event setting and to transfer said trigger event setting to the signal analyzer 100. For example, the neural network can be configured to process at least one autoset parameter of an input signal and, based on the processing result, determine at least a first trigger type and/or trigger parameter. Thereby, the autoset parameter may comprise an estimated frequency of the input signal, a peak value of the input signal, a median value of the input signal, or a histogram of the input signal. The signal can then be triggered by the trigger detection unit 105 based on the determined trigger type and/or trigger parameter.

Figure 2:
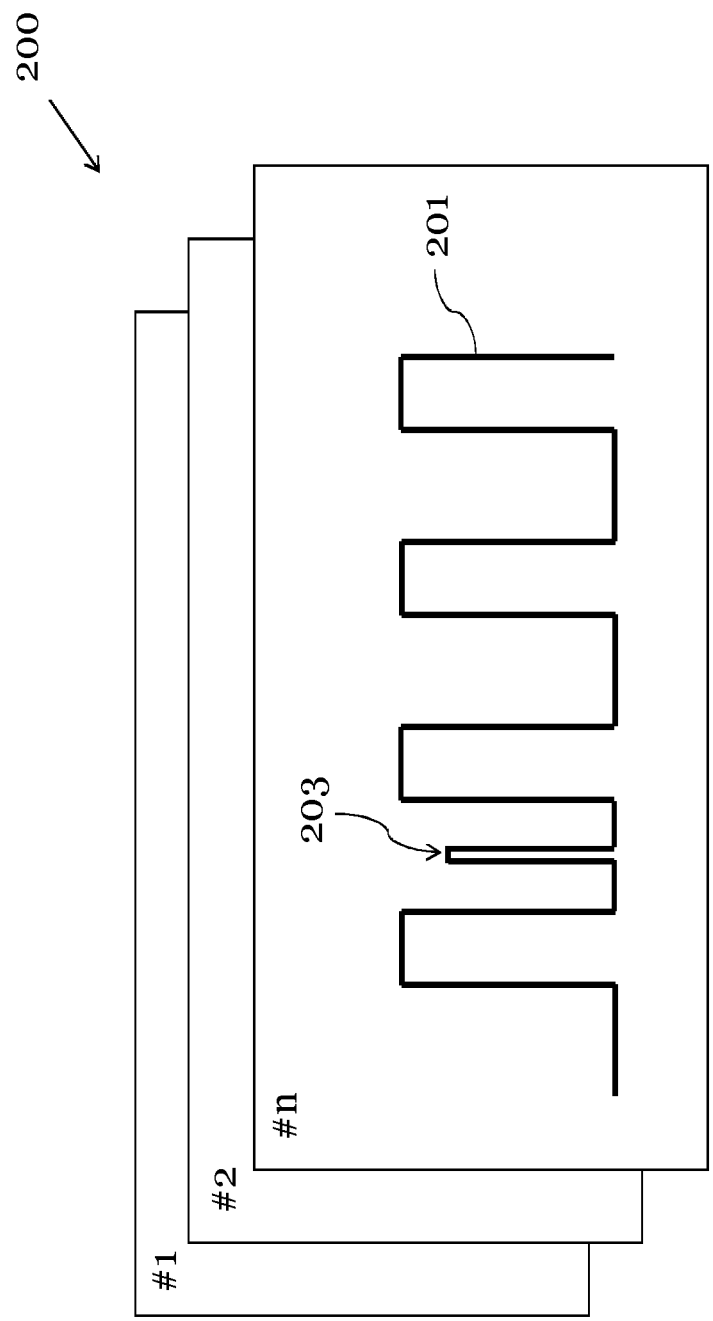
FIG. 2 shows stored segments of a digitized signal according to an embodiment.

FIG. 2 shows stored segments 200 of the digitized signal 201 according to an embodiment.

For example, the signal 201 stored in segment #n of FIG. 2 was recorded in time domain, i.e. the segment comprises the signal level over time. The signal 201 comprises an anomaly 203 in form of an irregular deviation the periodic signal. The anomaly search unit 111 can be configured to detect such an anomaly 203, by scanning the digitized signal 201 for deviations from the otherwise cyclical signal shape.

The acquisition unit 107 can be configured to acquire the segments 200 in the form of a snapshot of the digitized signal if the trigger detection unit 105 detects the trigger event. The segment 200 may comprise the signal as recorded within a certain time period. If the signal analyzer 100 is set to measure the signal in a frequency domain, the stored segment may also comprise a frequency spectrum of the signal.

Depending on the signal and/or measurement type, the anomaly search unit 111 can further be configured to detect signal anomalies based on a change, in particular a frequently occurring change, of the level of the digitized signal above or below a threshold value, and/or by a deviation of the digitized signal from a known signal spectrum.

The display 113 of the signal analyzer 100 can be configured to display the stored segments 200. A user can, for instance, select each segment for further analysis.

The anomaly search unit 111 can perform various analyzation methods in order to detect anomalies and glitches, such as fast Fourier transform (FFT) measurements, applying a histogram to the signal or other measurement types.

In particular, the trigger detection unit 105 and the anomaly search unit 111 can detect the trigger event respectively the signal anomaly based on similar signal characteristics, e.g. the signal level exceeding a threshold. However, the trigger detection unit 105 can thereby use a courser search pattern, e.g. a smaller threshold value, than the anomaly search unit. In this way, it can be prevented that segments which comprise anomalies are overlooked by the trigger detection unit 105.

Furthermore, the anomaly search unit 111 can be configured to analyze signal integrity effects the user has not thought of and, thus, did not set the trigger conditions to, independently of the trigger detection unit 105.

Figure 3:
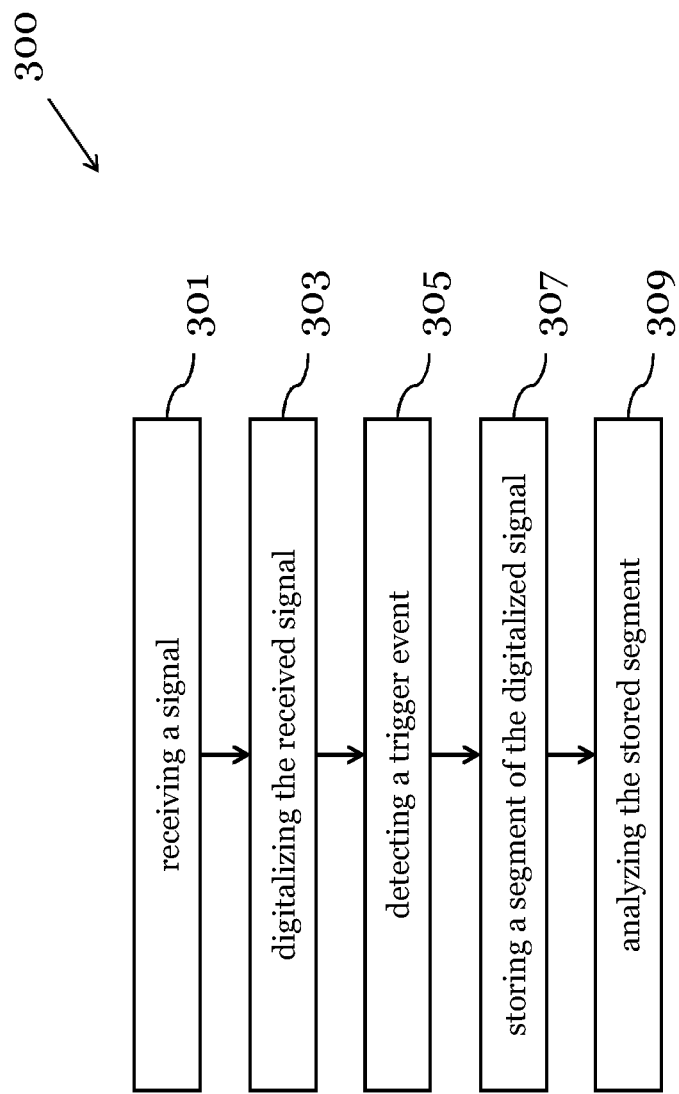
FIG. 3 shows a schematic diagram of a method for analyzing a signal according to an embodiment.

FIG. 3 shows a schematic diagram of a method 300 for analyzing a signal, in particular an RF signal, according to an embodiment. In particular, the method 300 can be carried out by the signal analyzer 100 shown in FIG. 1.

The method 300 comprises the steps of:
receiving 301 the signal;
digitizing 303 the received signal;
detecting 305 a trigger event in the digitized signal 201;
storing 307 a segment of the digitized signal 201 in the memory 109 if the trigger event is detected in the digitized signal 201; and
analyzing 309 the stored segment of the digitized signal 201 to detect signal anomalies 203, in particular glitches, in the stored segment of the digitized signal 201.

Preferably, the method further comprises the further step of displaying a list of: stored segments of digitized signals, detected signal anomalies and/or time stamps of the detected signal anomalies. The list can be displayed in the display 113 of the signal analyzer 100.

The step of analyzing 309 the stored segment 200 of the digitized signal 201 can be carried out by a machine learning algorithm, which is preferably employed by a trained neural network.

Preferably, the trigger event is detected based on the digital signal 201 exceeding or falling below a certain signal level and/or the digital signal having a certain preset signal shape. In particular, the trigger event, in particular a trigger type and/or a trigger parameter of the trigger event, can be determined by a further neural network.

Preferably, the signal anomalies are detected based on a change, in particular a frequently occurring change, of the level of the digitized signal above or below a threshold value, by a deviation of the digitized signal from a cyclical signal shape and/or by a deviation of the digitized signal from a known signal spectrum.

The signal anomalies can be associated with the signal, in particular with the digitized signal, more particular with the stored segment of the digitized signal.

All features of all embodiments described, shown and/or claimed herein can be combined with each other.

The invention claimed is:

1. A signal analyzer, comprising:
an interface configured to receive a signal, in particular a radio frequency (RF) signal;
an analog-to-digital converter configured to digitize the received signal;
one or more processors configured to detect a trigger event in the digitized signal based on the digital signal having a certain preset signal shape and a display,
wherein the one or more processors are configured to store a segment of the digitized signal in a memory of the signal analyzer if the trigger event is detected in the digitized signal,
wherein the one or more processors are configured to analyze the stored segment of the digitized signal in order to detect signal anomalies including glitches in the stored segment of the digitized signal,
wherein the display is configured to display a list of stored segments of digitized signals, detected signal anomalies, and time stamps of the detected signal anomalies, and
wherein the one or more processors are further configured to detect the signal anomalies by a deviation of the digitized signal from a known signal spectrum and by a deviation of the digitized signal from a cyclical signal shape.

2. The signal analyzer of claim 1, wherein the one or more processors are configured to use a machine learning algorithm to detect the anomalies in the stored segment of the digitized signal.

3. The signal analyzer of claim 1, wherein the one or more processors comprises a trained neural network.

4. The signal analyzer of claim 1, wherein the signal anomalies are associated with the stored segment of the digitized signal.

5. The signal analyzer of claim 1, wherein the one or more processors are configured to detect the signal anomalies based on a frequently occurring change, of the level of the digitized signal above or below a threshold value.

6. The signal analyzer of claim 1, wherein signal analyzer comprises an oscilloscope.

7. A method for analyzing a signal, in particular radio frequency (RF) signal, comprising:
- receiving the signal;
- digitizing the received signal;
- detecting a trigger event in the digitized signal based on the digital signal having a certain preset signal shape;
- storing a segment of the digitized signal in a memory if the trigger event is detected in the digitized signal;
- analyzing the stored segment of the digitized signal in order to detect signal anomalies including glitches in the stored segment of the digitized signal;
- displaying a list of stored segments of digitized signals, detected signal anomalies, and time stamps of the detected signal anomalies, and
- wherein the signal anomalies are detected by a deviation of the digitized signal from a known signal spectrum and by a deviation of the digitized signal from a cyclical signal shape.

8. The method of claim 7, wherein the step of analyzing the stored segment of the digitized signal is carried out by a machine learning algorithm, which is employed by a trained neural network.

9. The method of claim 7, wherein the trigger event is detected based on the digital signal exceeding or falling below a certain signal level and/or the digital signal having a certain preset signal shape.

10. The method of claim 7, wherein a trigger type and/or a trigger parameter of the trigger event is determined by a further neural network.

11. The method of claim 7, wherein the signal anomalies are associated with the stored segment of the digitized signal.

12. The method of claim 7, wherein the signal anomalies are detected based on a frequently occurring change, of the level of the digitized signal above or below a threshold value.

* * * * *